(12) United States Patent
Suzuki et al.

(10) Patent No.: US 8,320,155 B2
(45) Date of Patent: Nov. 27, 2012

(54) SEMICONDUCTOR INTEGRATED CIRCUIT DEVICE

(75) Inventors: Ryota Suzuki, Tokyo (JP); Kazuteru Ishizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 147 days.

(21) Appl. No.: 12/801,539

(22) Filed: Jun. 14, 2010

(65) Prior Publication Data

US 2011/0002159 A1 Jan. 6, 2011

(30) Foreign Application Priority Data

Jul. 3, 2009 (JP) ................................ 2009-158392

(51) Int. Cl.
*G11C 11/22* (2006.01)

(52) U.S. Cl. ................... 365/145; 365/149; 365/230.06

(58) Field of Classification Search .................. 365/145, 365/149, 230.06; 257/303
See application file for complete search history.

(56) References Cited

U.S. PATENT DOCUMENTS

| | | | | |
|---|---|---|---|---|
| 6,271,556 | B1 * | 8/2001 | Chen et al. ..................... | 257/303 |
| 6,888,766 | B2 * | 5/2005 | Takahashi ..................... | 365/201 |
| 7,203,099 | B2 * | 4/2007 | Kang ....................... | 365/189.16 |
| 7,332,392 | B2 * | 2/2008 | Lin et al. ....................... | 438/243 |
| 2007/0002601 | A1 | 1/2007 | Hasunuma et al. | |

FOREIGN PATENT DOCUMENTS

| | | |
|---|---|---|
| JP | 2001-332632 A | 11/2001 |
| JP | 2007-5502 A | 1/2007 |

\* cited by examiner

*Primary Examiner* — Son Dinh

(74) *Attorney, Agent, or Firm* — McGinn IP Law Group, PLLC

(57) ABSTRACT

A memory device including memory cells each have two transistors and one storage element connected in series in this order between a corresponding one of bit lines and a constant voltage. The two transistors respectively have gate electrodes respectively connected to a corresponding one of first word lines and a corresponding one of second word lines. A memory array includes mats each having the memory cells disposed at all intersections between the bit lines and the first word lines, sense amplifiers each input with a corresponding pair of the bit lines in the same mat as a bit line pair, and first and second word drivers adapted to activate the first and second word lines, respectively.

20 Claims, 10 Drawing Sheets

SEMICONDUCTOR INTEGRATED CIRCUIT DEVICE

This application is based upon and claims the benefit of priority from Japanese patent application No. 2009-158392, filed on Jul. 3, 2009, the disclosure of which is incorporated herein in its entirety by reference.

TECHNICAL FIELD

This invention relates to a semiconductor integrated circuit device and, more specifically, relates to a memory array excellent in noise characteristics and small in size and to a semiconductor integrated circuit device having such a memory array.

BACKGROUND ART

The scale and integration density of semiconductor integrated circuit devices have been increasing with the lapse of time and, following it, various circuit systems and various element layout methods have been developed and used. For example, a dynamic random access memory (DRAM) uses a differential sense system in which a pair of bit lines with the same number of memory cells connected thereto are input to a sense amplifier. The sense amplifier amplifies only the voltage difference between the pair of bit lines, thereby canceling equal noise voltages and thus amplifying only a signal. This achieves low noise so that a very weak signal appearing in one of the pair of bit lines from the selected memory cell is stably discriminated. However, the properties of this discrimination are deeply related to the positional relationship of the pair of bit lines with the sense amplifier. As major bit line layout methods, there are an open bit line layout (FIG. 11) and a folded bit line layout (FIG. 12).

In the open bit line layout shown in FIG. 11, a pair of bit lines to be differential inputs to each of sense amplifiers SA are arranged in upper and lower different memory cell arrays. Word lines from word drivers WD are orthogonal to the bit lines and a memory cell at an intersection between the corresponding word and bit lines is selected. In the figure, the memory cell size is, for example, 2F (length)×2F (width), i.e. $4F^2$. Herein, F is a feature size and is generally set to a minimum dimension and the memory cell size is given by the product ($4F^2$) of the length (2F) and the width (2F). This open bit line layout is a cross-point memory cell array structure in which memory cells are disposed at all intersections between word lines and bit lines and thus it is possible to arrange small memory cells such as $4F^2$ or $6F^2$ memory cells that make it difficult to form passing word lines. Therefore, the size (area) of the memory cell array can be made small. However, since each pair of bit lines are arranged in the different memory cell arrays, noise generated in one of the memory cell arrays appears on only one of the bit line pair and thus the open bit line layout is weak against noise. Further, since a signal appears on all bit lines crossing the selected word line, the sense amplifiers are required as many as the number of bit lines for amplification for read, write, or rewrite.

On the other hand, in the folded bit line layout shown in FIG. 12, a pair of bit lines to be differential inputs to each of sense amplifiers SA are arranged in the same memory cell array. However, as shown in the figure, since memory cells can be disposed at only half of intersections between word lines and bit lines, it is necessary to pass superfluous word lines. Even if small memory cells such as $4F^2$ or $6F^2$ memory cells are arrayed, superfluous word lines are required therebetween in a memory cell array. Therefore, practically, relatively large memory cells such as $8F^2$ memory cells are arrayed so that the memory cell array area relatively increases. However, since each pair of bit lines are arranged in the same memory cell array, noise generated in one of memory cell arrays appears on both bit lines forming a pair and thus is canceled as in-phase signals. Therefore, the folded bit line layout is excellent in noise characteristics. Further, since each pair of bit lines are arranged in the same memory cell array, it is possible to share each sense amplifier by the memory cell arrays on the opposite sides with respect to the sense amplifier by adding switching transistors for switching connection of the bit lines to the sense amplifier. Therefore, it is possible to halve or reduce the sense amplifier area.

As described above, the open bit line layout can make the memory cell array small, but has the problem that it is weak against noise. On the other hand, the folded bit line layout is excellent in noise characteristics, but has the problem that the memory cell array cannot be made small. As prior art patent documents relating to the above-mentioned open bit line layout and folded bit line layout, there are JP-A-2007-5502 and JP-A-2001-332632.

SUMMARY

Problem to be Solved by the Invention

As described above, the open bit line layout and the folded bit line layout both have merits and demerits in terms of noise characteristics and memory cell array size. In the open bit line layout, since memory cells can be disposed at all intersections between word lines and bit lines, there is the advantage that a memory cell array can be made small. However, since each pair of bit lines are arranged in different memory cell arrays, there is the disadvantage that the noise characteristics are poor. In the folded bit line layout, since memory cells can be disposed at only half of intersections between word lines and bit lines, there is the disadvantage that a memory cell array becomes large. However, since each pair of bit lines are arranged in the same memory cell array, there is the advantage that the noise characteristics are excellent.

This invention provides a memory array excellent in noise characteristics and small in size and a semiconductor integrated circuit device having such a memory array.

Means for Solving the Problem

In one embodiment, there is provided a semiconductor integrated circuit device that includes a memory array comprising mats each comprising memory cells each having two transistors and one storage element connected in series in this order between a corresponding one of bit lines and a constant voltage, said two transistors respectively having gate electrodes respectively connected to a corresponding one of first word lines orthogonal to said bit lines and a corresponding one of second word lines parallel to said bit lines, and said memory cells disposed at all intersections between said bit lines and said first word lines, sense amplifiers each input with a corresponding pair of the bit lines in the same mat as a bit line pair, first word drivers adapted to activate said first word lines, respectively; and second word drivers adapted to activate said second word lines, respectively.

In another embodiment, there is provided a memory array comprising mats each comprising memory cells each having two transistors and one storage element connected in series in this order between a corresponding one of bit lines and a constant voltage, said two transistors respectively having gate electrodes respectively connected to a corresponding one of first word lines and a corresponding one of second word lines, and said memory cells disposed at all intersections between said bit lines and said first word lines, sense amplifiers each input with a corresponding pair of the bit lines in the same mat as a bit line pair; and first and second word drivers adapted to activate said first and second word lines, respectively.

Further, in another embodiment, there is provided a method for accessing a semiconductor integrated circuit device that includes a memory array comprising mats each comprising memory cells each having two transistors and one storage element connected in series in this order between a corresponding one of bit lines and a constant voltage, said two transistors respectively having gate electrodes respectively connected to a corresponding one of first word lines orthogonal to said bit lines and a corresponding one of second word lines parallel to said bit lines, and said memory cells disposed at all intersections between said bit lines and said first word lines, sense amplifiers each input with a corresponding pair of the bit lines in the same mat as a bit line pair, first word drivers adapted to activate said first word lines, respectively, and second word drivers adapted to activate said second word lines, respectively, wherein a first memory cell is accessed by selecting the corresponding first and second word lines, and then a second memory cell is accessed by non-selecting said second word line, precharging and equalizing the bit lines, and selecting the second word line at a different address.
Effect of the Invention According to the present invention, each of memory cells comprises two transistors and one storage element and gates of the two transistors are respectively connected to a corresponding one of first word lines and a corresponding one of second word lines orthogonal to the first word lines, thereby enabling the folded bit line layout while disposing the memory cells at all intersections between the word lines and the bit lines. Since the memory cells are disposed at all intersections between the word lines and the bit lines, the size of a memory array can be made small and, further, by employing the folded bit line layout, the memory array is excellent in noise characteristics.

BRIEF DESCRIPTION OF THE DRAWINGS

The above feature and advantage of the present invention will be more apparent from the following description of certain preferred embodiments taken in conjunction with the accompanying drawings in which.

DETAILED DESCRIPTION OF PREFERRED EMBODIMENTS

Figure 1:
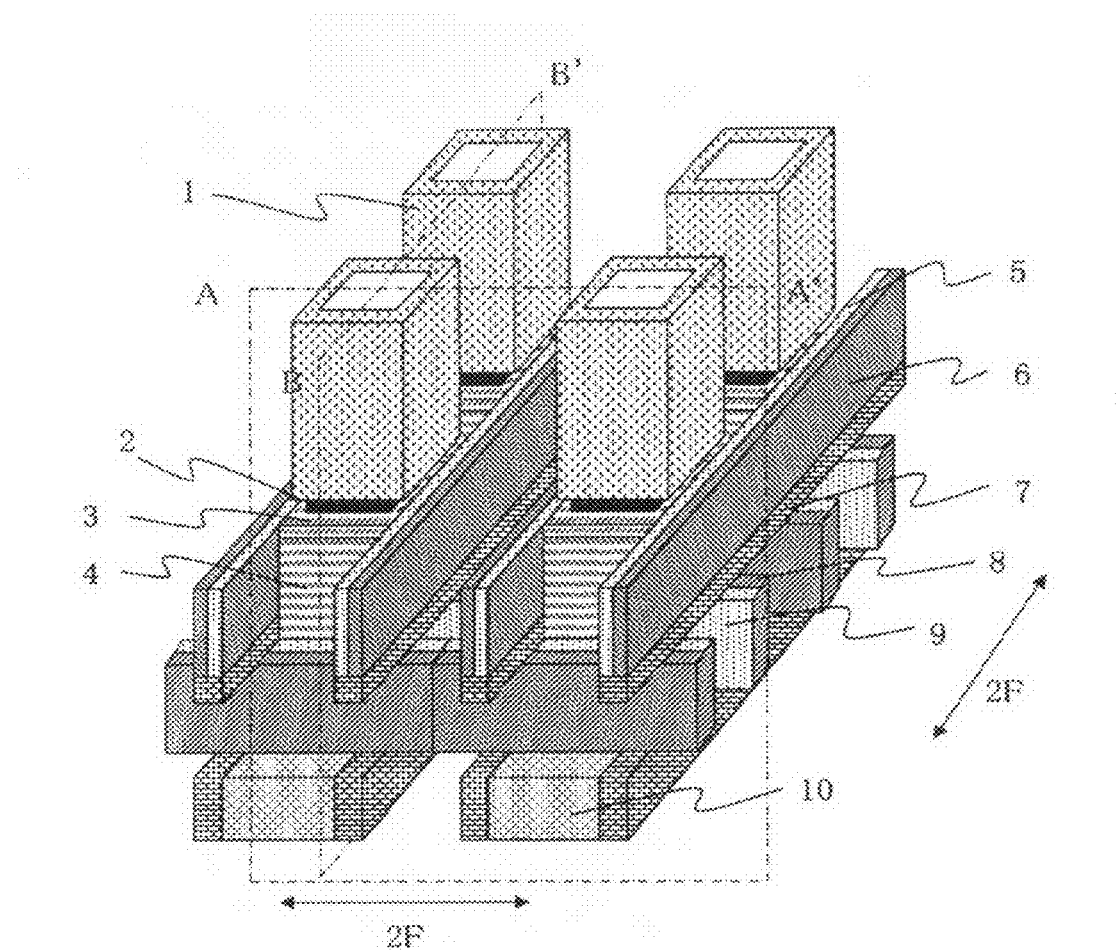
FIG. 1 is a structural view of memory cells of the present invention.
Figure 3:
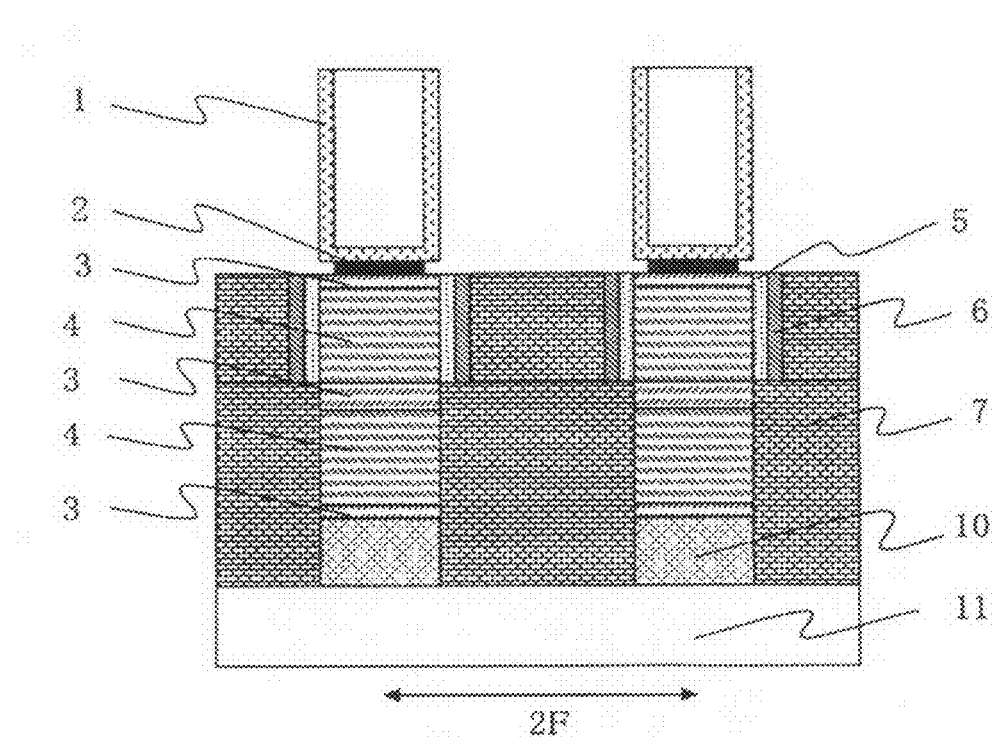
FIG. 3 is a sectional structural view of the memory cells of the present invention, taken along line A-A' in FIG. 1, i.e. taken in a direction orthogonal to bit lines.
Figure 4:
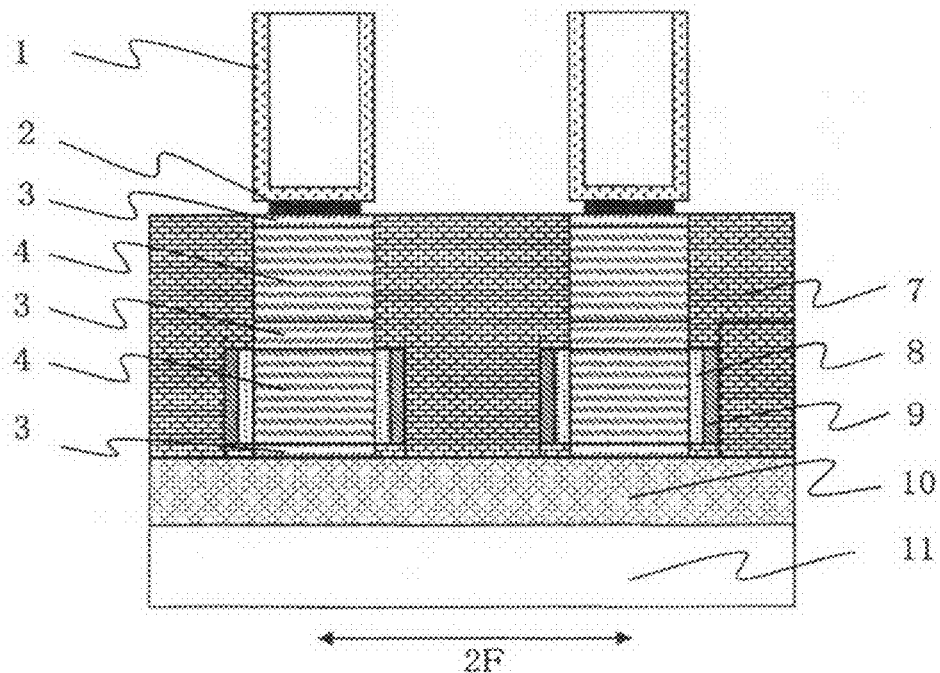
FIG. 4 is a sectional structural view of the memory cells of the present invention, taken along line B-B' in FIG. 1, i.e. taken in a direction parallel to the bit lines.
Figure 5:
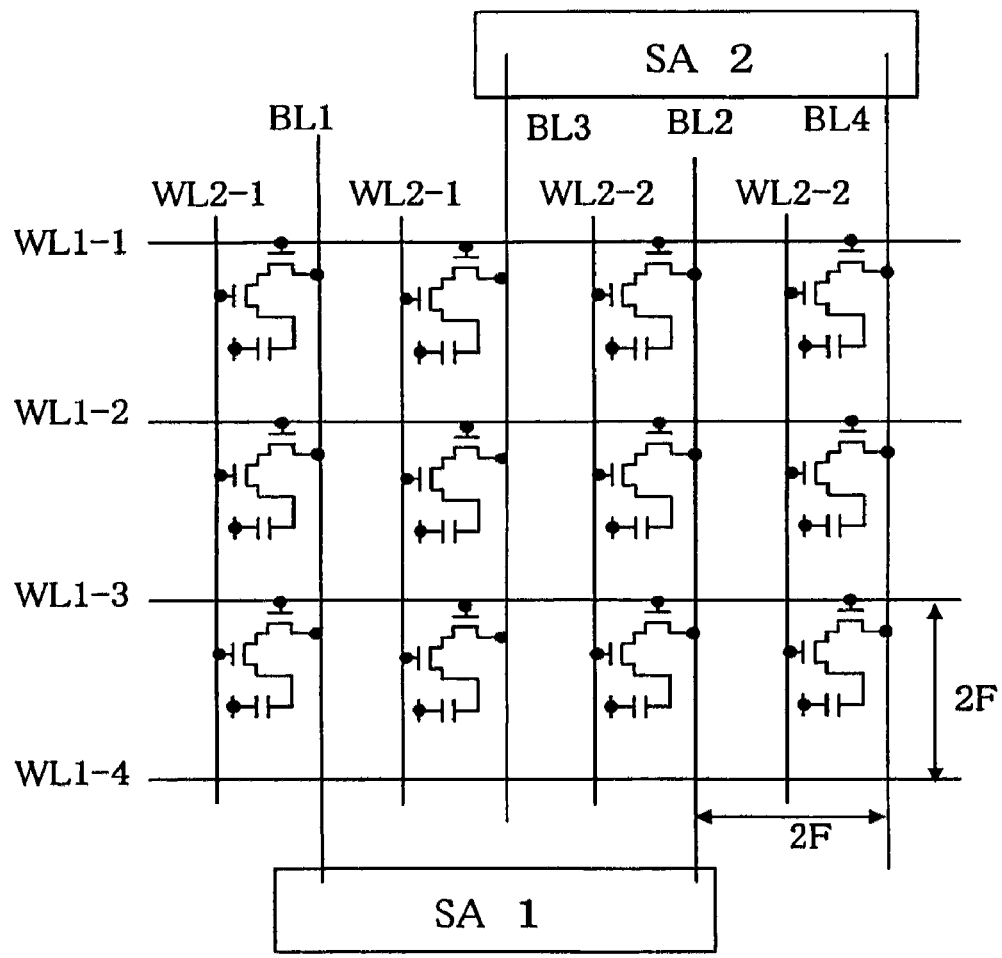
FIG. 5 is a layout explanatory diagram of a memory array of the present invention.
Figure 6:
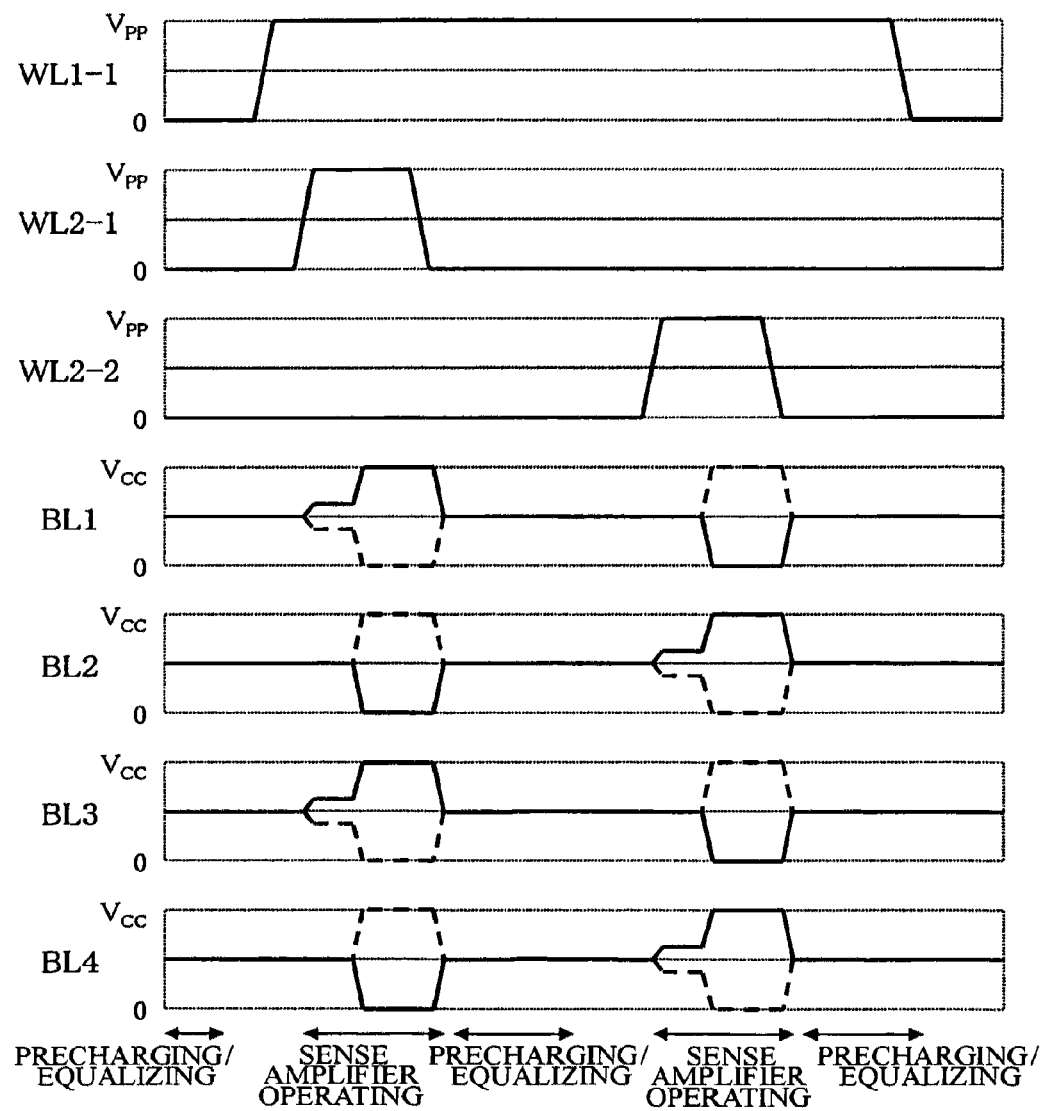
FIG. 6 is a timing diagram for explaining a memory array access method of the present invention.

The invention will be described in detail with reference to the drawings. FIG. 1 is a structural view of memory cells of the present invention, FIG. 2 is a circuit diagram of the memory cell of the present invention, FIG. 3 is a sectional structural view of the memory cells of the present invention, taken along line A-A' in FIG. 1, i.e. taken in a direction orthogonal to bit lines, FIG. 4 is a sectional structural view of the memory cells of the present invention, taken along line B-B' in FIG. 1, i.e. taken in a direction parallel to the bit lines, FIG. 5 is a layout explanatory diagram of a memory array of the present invention, and FIG. 6 is a timing diagram for explaining a memory array access method of the present invention.

Figure 2:
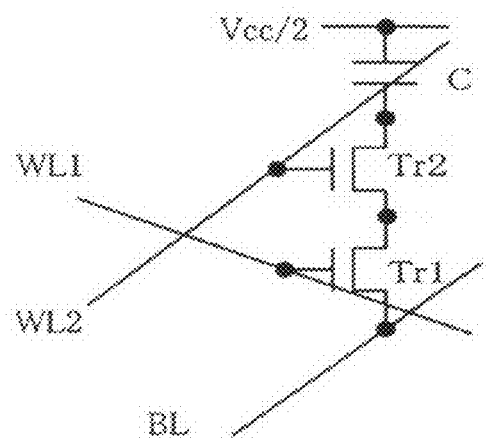
FIG. 2 is a circuit diagram of the memory cell of the present invention.

Referring first to FIG. 2, the circuit structure of the memory cell will be described. The memory cell comprises two transistors (Tr1, Tr2) and one storage element. The storage element is not particularly limited, but will hereinbelow be described as a capacitor which is the most popular as the storage element. As shown in FIG. 2, Tr1, Tr2, and the capacitor C are connected in series in this order between a corresponding one of bit lines BL and a constant potential (Vcc/2). As the operation of the memory cell, the two selection transistors Tr1 and Tr2 connected between the capacitor C and the bit line BL are activated to conduct so that the capacitor C is accessed. In the present invention, the transistor Tr1 has a gate connected to a corresponding one of first word lines WL1 and the transistor Tr2 has a gate connected to a corresponding one of second word lines WL2. The first word lines WL1 extend in a direction orthogonal to the bit lines BL and the second word lines WL2 extend in a direction parallel to the bit lines BL. Since the first and second word lines are arranged orthogonal to each other, a selection is made of the memory cell at an intersection between the corresponding first and second word lines.

Next, the structure of the memory cells will be described with reference to a manufacturing method thereof. Referring to FIGS. 1, 3, and 4, a description will be given of an example of memory cell manufacturing processes. An oxide film and a nitride film are grown on the entire surface of a silicon substrate 11. Then, the nitride film is patterned in conformity with surround gate transistor forming portions. Using the patterned nitride film as a mask, etching is carried out to form silicon pillars 4. Then, the silicon pillars are subjected to side-surface oxidation and formed with a nitride film and then, by entire-surface etch back, a sidewall is formed. Thereafter, arsenic (As), phosphorus (P), or the like is implanted at the root of the silicon pillars to form a buried diffusion layer which will serve as bit lines 10.

Then, the sidewall nitride film is removed by oxide film etching and nitride film etching. Gate insulating films 8 and gate electrodes 9 are formed and subjected to etch back, thereby forming the gates of first cell transistors on lower side surfaces of the silicon pillars in a direction perpendicular to the buried bit lines. An interlayer oxide film 7 is formed up to the middle of the silicon pillars and then the silicon pillars are again subjected to side-surface oxidation and formed with a nitride film and then, by entire-surface etch back, a sidewall is formed. Thereafter, arsenic (As), phosphorus (P), or the like is implanted and then gate insulating films 5 and gate electrodes 6 of second cell transistors are formed on upper side surfaces of the silicon pillars in the same direction of the buried bit lines 10. Then, an interlayer oxide film 7 is formed up to the top of the silicon pillars and then the nitride film on the silicon pillars is removed. Then, arsenic (As), phosphorus (P), or the like is implanted to form an N+ diffusion layer 3. Thereafter, capacitor contacts 2 for capacitor connection and capacitors 1 are formed.

By the above-mentioned manufacturing method, there are obtained the two-transistor one-capacitor memory cells with the bit lines buried in the semiconductor substrate, wherein each memory cell has the surround gate transistors stacked in two tiers at the same planar position and the stack capacitor formed thereon. Since the surround gate transistors stacked in two tiers are arranged orthogonal or parallel to the bit lines, the gate electrodes of the second transistors are shown in cross-section in FIG. 3 and the gate electrodes of the first transistors are shown in cross-section in FIG. 4. In the above-mentioned example, the buried bit lines are formed in the semiconductor substrate and the capacitor is formed as the stack capacitor above the semiconductor substrate. However, the present invention is not limited to such a structure. Specifically, the manufacturing order of the bit lines and the capacitors may be reversed, i.e. capacitors are first formed as trench capacitors in a semiconductor substrate and bit lines are formed above transistors.

In either case, the transistors of each two-transistor one-capacitor memory cell are formed by the surround gate transistors each having the gate insulating film and the gate electrode formed surrounding the semiconductor substrate layer and the two transistors are stacked at the same planar position. Even if the number of the selection transistors is two, the plane area thereof can be equal to that of one transistor by stacking them at the same planar position as the surround gate transistors. By stacking the bit line, the two transistors, and the capacitor in the manner described above, it is possible to obtain a small memory cell size of, for example, 2F (length)× 2F (width), i.e. $4F^2$.

Next, a memory array access method will be described with reference to FIGS. 5 and 6. FIG. 5 is a layout explanatory diagram of a memory array. Each of two-transistor one-capacitor memory cells has length and width dimensions of 2F, respectively, and thus has a cell size of $4F^2$ two-dimensionally. In the figure, gates of first transistors of the memory cells are connected to first word lines (WL1-1 to WL1-4), respectively, gates of second transistors of the memory cells are connected to second word lines (WL2-1, WL2-2), respectively, and bit lines (BL1 to BL4) are arranged to extend in the longitudinal direction. Herein, the bit line BL1 and the bit line BL2 form a bit line pair and are connected to a sense amplifier SA1. Likewise, the bit line BL3 and the bit line BL4 form a bit line pair and are connected to a sense amplifier SA2.

Figure 12:
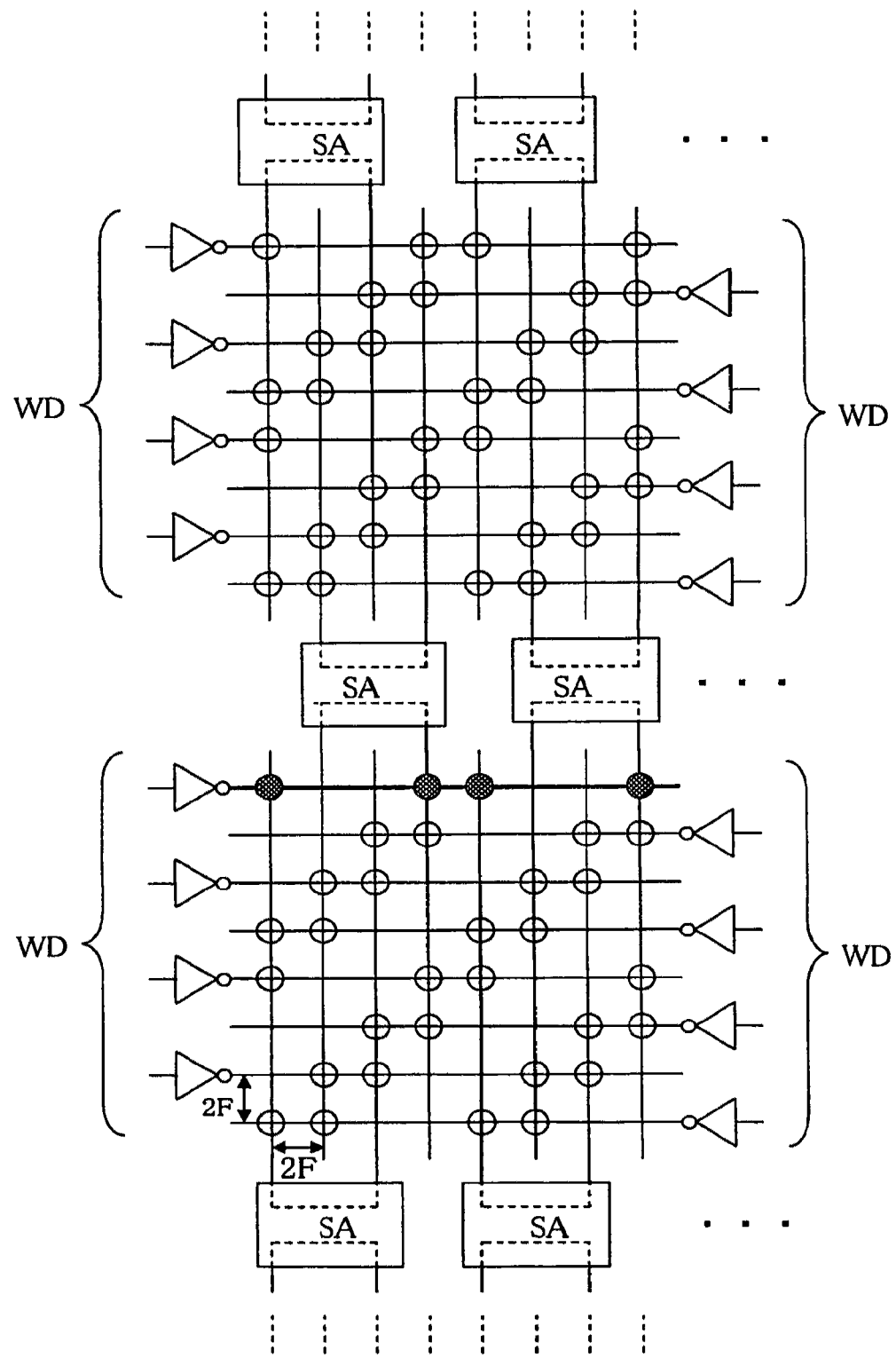
FIG. 12 is a layout explanatory diagram of a memory array of folded bit line layout.

In FIG. 5, the bit line layout is a folded bit line layout in which the bit line pair (BL1 and BL2, BL3 and BL4) in the same memory cell array or mat, which will be described later, are used as differential inputs to the sense amplifier. In the figure, the first word lines WL1 are arranged to extend in the transverse direction, the second word lines WL2 and the bit lines BL are arranged to extend in the longitudinal direction, and the memory cells are disposed at all intersections between the bit lines BL (or the second word lines WL2) and the first word lines WL1. By disposing the memory cells at all intersections, it is not necessary to wire superfluous word lines as shown in FIG. 12 and thus it is possible to form a memory array with the predetermined memory cell size of $4F^2$. Further, the bit lines are arranged in order of BL1, BL3, BL2, and BL4 and the sense amplifiers are disposed at upper and lower ends of the bit lines. By alternately arranging the bit lines of the pairs in this manner, the layout width of the sense amplifiers can be set to that of three memory cells and thus a design is facilitated.

Referring to FIG. 6, the timing of memory array access will be described. First, the sense amplifiers and the bit lines are precharged and equalized. The first and second word lines are selected so that the selected memory cells are activated. A row of the memory array is selected by the first word line and, herein, WL1-1 is selected. WL2-1 is selected as the second word line so that the memory cells selected by the first and second word lines are accessed, voltage amplification is performed by the sense amplifiers, and read, write, or rewrite is performed. In this event, in the bit line pair input to the sense amplifier, the bit line (BL1, BL3) to which the selected memory cell is connected is called a true bit line, while the bit line (BL2, BL4) to which the selected memory cell is not connected is called a dummy bit line.

Upon completion of access to the memory cells, the second word line WL2-1 being selected is returned to the non-selected state. Then, again, the sense amplifiers and the bit lines are precharged and equalized and then the second word line WL2-2 specified by a different address is selected. The memory cells selected by the selected first and second word lines are accessed, voltage amplification is performed by the sense amplifiers, and read, write, or rewrite is performed. Upon completion of access to the memory cells, the second word line WL2-2 being selected is returned to the non-selected state. Then, again, the sense amplifiers and the bit lines are precharged and equalized and then the first word line WL1-1 being selected is returned to the non-selected state.

As described above, the first and second word lines are selected so that the memory cells at the intersections therebetween are selected and accessed. A row of the memory array is selected by the first word line and columns of the memory array are selected by the second word line. Herein, the two second word lines are continuously selected in a time period when the specific first word line is activated. However, the number of second word lines to be continuously selected is not limited and can be set free.

Memory cells of the present invention each comprise two transistors and one storage element (e.g. capacitor). The two transistors of the memory cell have a surround gate transistor structure and are stacked in two tiers at the same planar position. By stacking the surround gate transistors, the memory cell size can be made small, for example, $4F^2$ despite the number of transistors being two. The memory cells are disposed at all intersections between bit lines (or second word lines) and first word lines. Further, the bit line layout is a folded bit line layout in which a pair of bit lines in the same memory cell array or mat are used as differential inputs to a sense amplifier. In this manner, according to the present invention, the folded bit line layout can be employed while disposing the memory cells at all intersections between the bit lines and the first word lines. Therefore, there is obtained a memory array excellent in noise characteristics and small in size.

Hereinabove, the description has been given of the memory cells of the present invention, the basic memory array layout thereof, and the operation thereof. Next, in terms of embodiments, the layout of a memory array including sense amplifiers and word drivers disposed around memory cell arrays or mats will be described in detail.

(First Embodiment)

Figure 7:
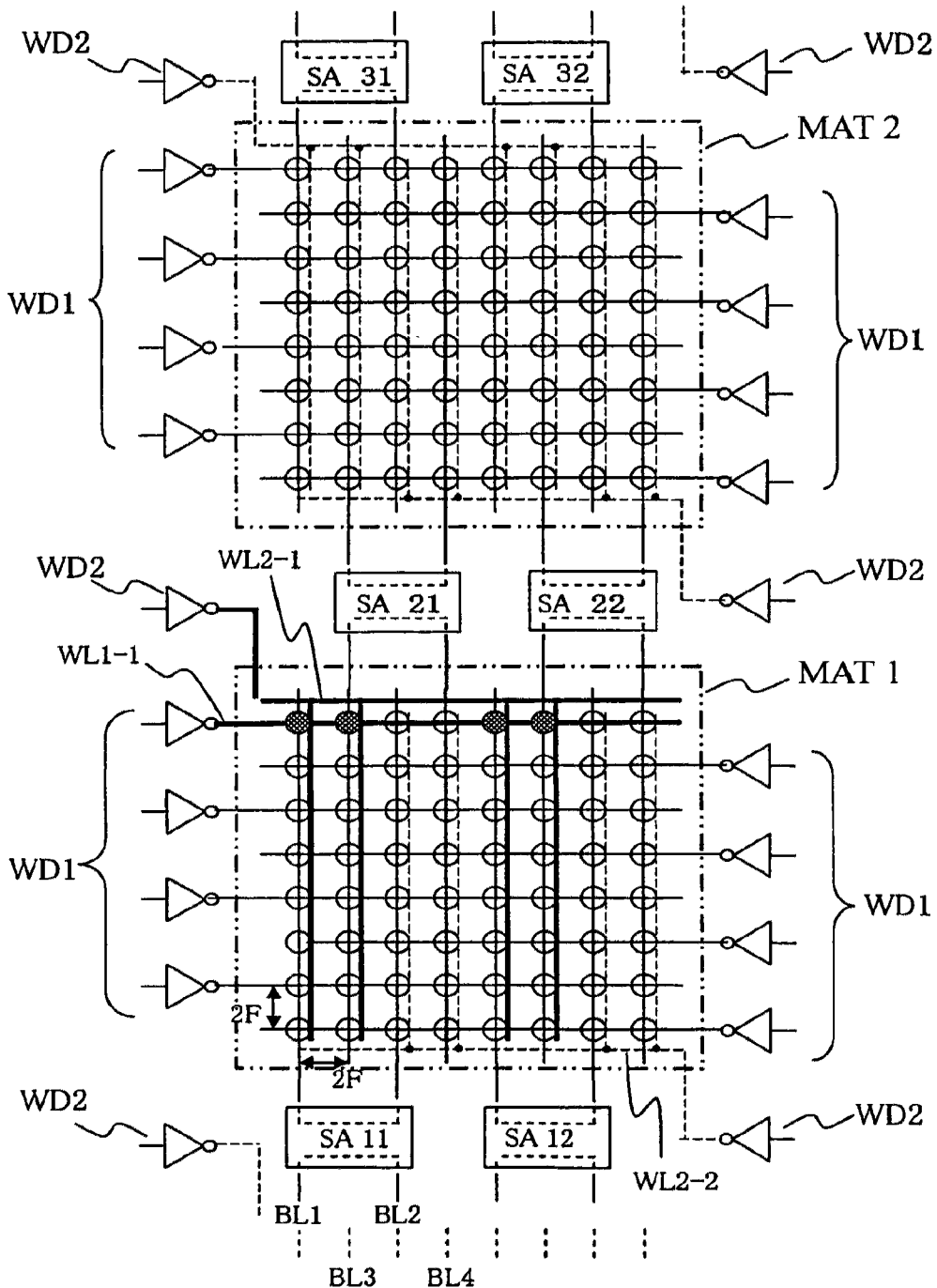
FIG. 7 is an explanatory diagram of memory cell selection (1) in a first embodiment of the present invention.
Figure 8:
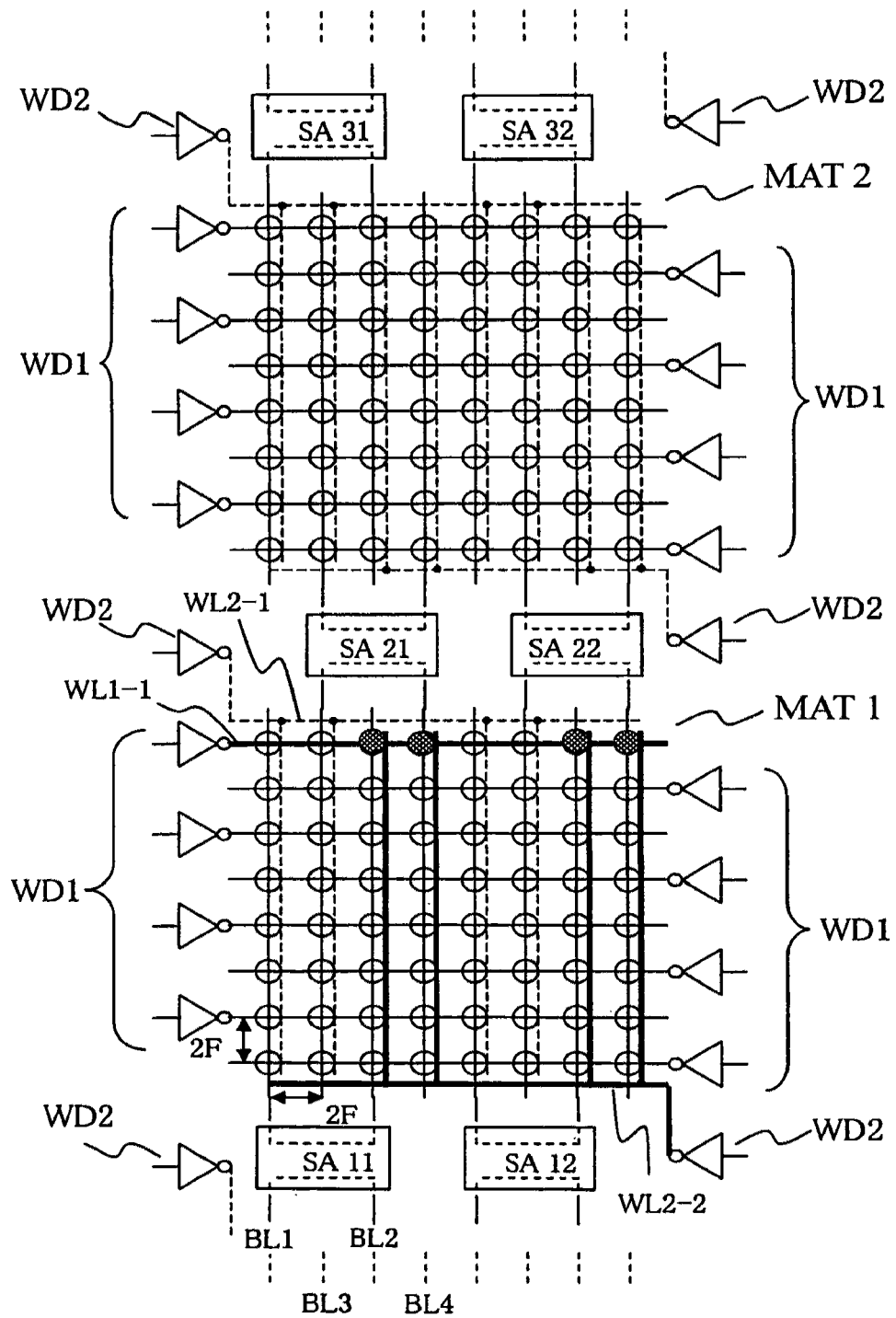
FIG. 8 is an explanatory diagram of memory cell selection (2) in the first embodiment of the present invention.

The first embodiment of the present invention will be described in detail with reference to FIGS. 7 and 8. FIG. 7 shows the case where memory cells respectively connected to bit lines BL1 and BL3 are selected by a second word line WL2-1 and FIG. 8 shows the case where memory cells respectively connected to bit lines BL2 and BL4 are selected by a second word line WL2-2.

A memory array comprises sense amplifiers SA, a memory cell array 1 (hereinafter also referred to as a "mat 1"), sense amplifiers SA, a memory cell array 2 (hereinafter also referred to as a "mat 2"), and sense amplifiers SA, which are disposed in this order from the lower side to the upper side in the figure. The sense amplifiers are disposed on the upper and lower sides of the mats 1 and 2. A plurality of first word drivers WD1 are disposed on each of the left and right sides of the memory cell arrays 1 and 2 and a second word driver WD2 is disposed on each of the left and right sides of the sense amplifiers SA. A region where memory cells are arranged in a matrix is defined as a memory cell array (hereinafter also referred to as a "mat") and a region including a mat or mats and sense amplifiers and word drivers disposed therearound is defined as a memory array. The shown memory array employs the folded bit line layout, wherein each bit line is provided with a switching transistor (not shown) for switching connection to the sense amplifier and each sense amplifier is shared by the upper and lower mats so as to be switchably used. Herein, the numbers of memory cells, sense amplifiers, and word drivers are not particularly limited and can be arbitrarily selected.

The memory cells are arranged in n rows and m columns in each mat. In each mat, the memory cell on the upper left in the figure is identified as a memory cell 11 and the memory cell on the lower right in the figure is identified as a memory cell nm. The bit lines are arranged to extend in the longitudinal direction in the figure. First word lines from the first word drivers WD1 are arranged to extend in the transverse direction so as to be orthogonal to the bit lines. Second word lines from the second word drivers WD2 are arranged to extend in the longitudinal direction so as to be parallel to the bit lines. The first word drivers WD1 are disposed on both sides of each mat and the second word driver WD2 is disposed at an intersection between the sense amplifier region and the first word driver region on each side of each sense amplifier region.

Herein, since the sense amplifiers and the bit lines are repeatedly arranged in the transverse direction, the sense amplifiers in the same sense amplifier region are each identified by a second suffix and the bit lines are repeatedly assigned the same symbols (BL1 to BL4). The sense amplifiers SA11 and SA12 are each shared by a non-illustrated lower mat and the mat 1 and each receive the bit lines BL1 and BL2 as inputs. The sense amplifiers SA21 and SA22 are each shared by the mat 1 and the mat 2 and each receive the bit lines BL3 and BL4 as inputs. The sense amplifiers SA31 and SA32 are each shared by the mat 2 and a non-illustrated upper mat and each receive the bit lines BL1 and BL2 as inputs. Further, by the corresponding second word line WL2-1 or WL2-2 from the second word driver, each of these sense amplifiers receives one of the bit lines BL1 and BL2 (or BL3 and BL4) as a true bit line and the other as a dummy bit line. In this manner, the memory cells at intersections between the first word line from the first word driver and the second word line from the second word driver are selected.

In FIG. 7, one of the first word drivers WD1 is selected so that the first word line WL1-1 is activated and one of the second word drivers WD2 is selected so that the second word line WL2-1 is activated. As a result, the word lines indicated by thick lines in the figure are activated so that the memory cells at intersections therebetween, i.e. the crosshatched memory cells in the figure, are selected. That is, the sense amplifier SA11 senses the memory cell 11 in the mat 1. In this event, the sense amplifiers SA11 receives the bit line BL1 as a true bit line and the bit line BL2 as a dummy bit line. The sense amplifier SA12 receives the bit line BL1 as a true bit line and the bit line BL2 as a dummy bit line and senses the memory cell 15. The sense amplifier SA21 receives the bit line BL3 as a true bit line and the bit line BL4 as a dummy bit line and senses the memory cell 12. The sense amplifier SA22 receives the bit line BL3 as a true bit line and the bit line BL4 as a dummy bit line and senses the memory cell 16. In this manner, the respective sense amplifiers access and sense the corresponding memory cells.

FIG. 8 is opposite to FIG. 7 and shows the case where the second word line WL2-2 is activated and thus the true and dummy bit lines of the bit line pairs are reversed. One of the first word drivers WD1 is selected so that the first word line WL1-1 is activated and one of the second word drivers WD2 is selected so that the second word line WL2-2 is activated. As a result, the word lines indicated by thick lines in the figure are activated so that the memory cells at intersections therebetween, i.e. the crosshatched memory cells disposed in the mat 1 in the figure, are selected. That is, the sense amplifier SA11 receives the bit line BL1 as a dummy bit line and the bit line BL2 as a true bit line and senses the memory cell 13. The sense amplifier SA12 receives the bit line BL1 as a dummy bit line and the bit line BL2 as a true bit line and senses the memory cell 17. The sense amplifier SA21 receives the bit line BL3 as a dummy bit line and the bit line BL4 as a true bit line and senses the memory cell 14. The sense amplifier SA22 receives the bit line BL3 as a dummy bit line and the bit line BL4 as a true bit line and senses the memory cell 18.

In this embodiment, the sense amplifiers are disposed on the upper and lower sides of each mat and are each shared by the upper and lower mats. The first word drivers are disposed on both sides of each mat and the second word driver is disposed on each side of each sense amplifier region. The mat and a row in that mat are selected by an output from the first word driver and true and dummy bit lines of bit line pairs are selected by an output from the second word driver. By the outputs from the first and second word drivers, the memory cells can be selected and accessed. By disposing the first and second word drivers in this manner, it is possible to select the memory cells of the memory array excellent in noise characteristics and small in size.

(Second Embodiment)

The second embodiment of the present invention will be described in detail with reference to FIG. 9. In this embodiment, second word drivers are each shared by adjacent mats. This embodiment differs from the first embodiment in that since the second word drivers are each shared by the adjacent mats, the second word driver provided on each side of each sense amplifier region in the first embodiment is provided on only one side of each sense amplifier region in this embodiment. The same symbols are assigned to the same components as those in the first embodiment, thereby omitting explanation thereof. Second word drivers WD2 shown in FIG. 9 are shared by a lower mat (not shown) and a mat 1, the mat 1 and a mat 2, and the mat 2 and an upper mat (not shown), respectively.

Figure 9:
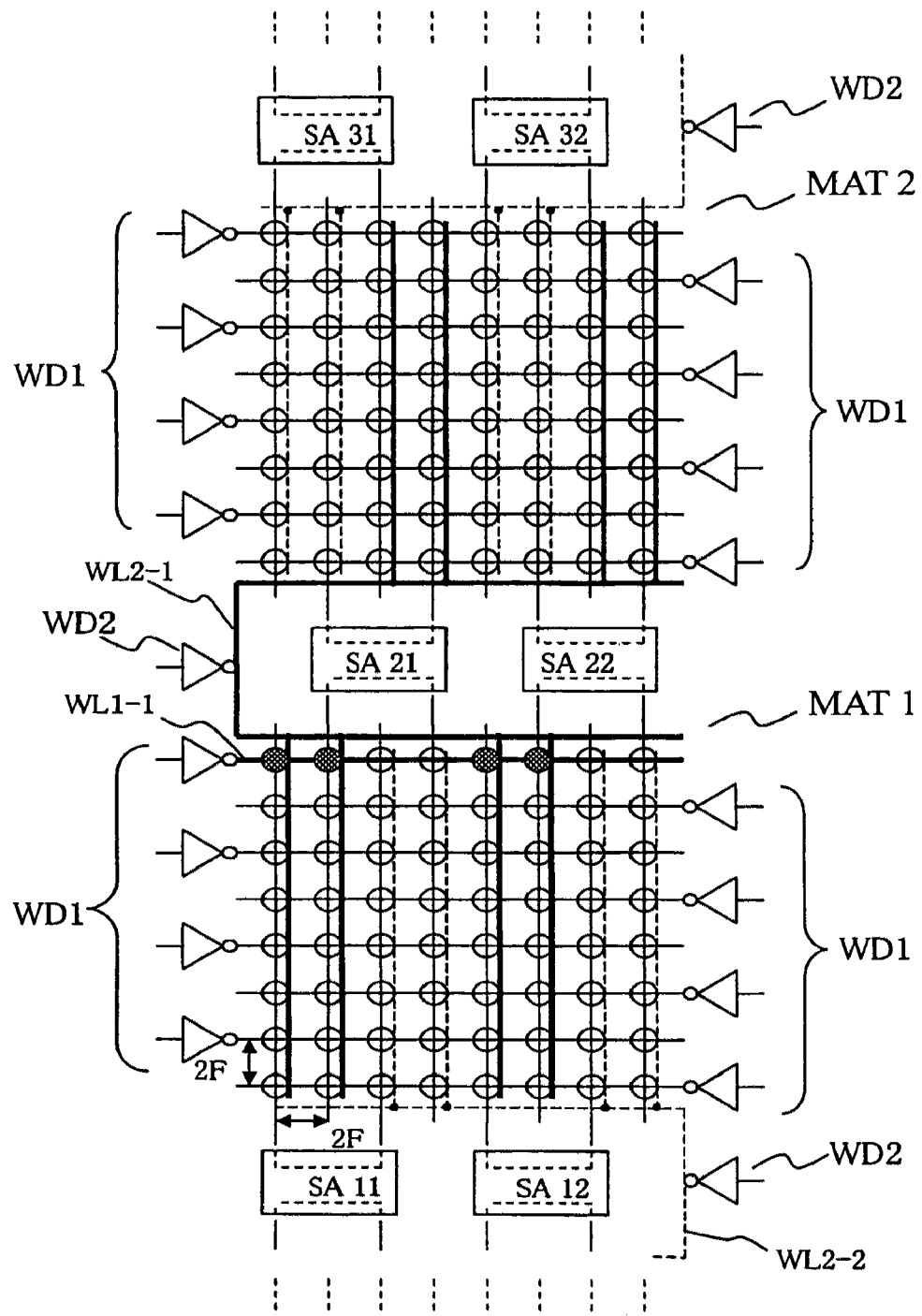
FIG. 9 is an explanatory diagram of memory cell selection in a second embodiment of the present invention.

In FIG. 9, one of first word drivers WD1 is selected so that a first word line WL1-1 is activated and one of the second word drivers WD2 is selected so that a second word line WL2-1 is activated. As a result, the word lines indicated by thick lines in the figure are activated so that memory cells at intersections therebetween, i.e. the crosshatched memory cells disposed in the mat 1 in the figure, are selected. That is, a sense amplifier SA11 receives a bit line BL1 as a true bit line and a bit line BL2 as a dummy bit line and senses a memory cell 11. A sense amplifier SA12 receives a bit line BL1 as a true bit line and a bit line BL2 as a dummy bit line and senses a memory cell 15. A sense amplifier SA21 receives a bit line BL3 as a true bit line and a bit line BL4 as a dummy bit line and senses a memory cell 12. A sense amplifier SA22 receives a bit line BL3 as a true bit line and a bit line BL4 as a dummy bit line and senses a memory cell 16.

In this embodiment, the second word drivers are each shared by the upper and lower mats. Therefore, there is an effect that the number of second word drivers can be reduced. For example, the second word driver WD2 is shared by the mat 1 and the mat 2 and the same second word line WL2-1 is wired in the two mats 1 and 2. By an output from the first word driver, the mat 1 or the mat 2 is selected and further a row in the selected mat is selected. By disposing the first and second word drivers in this manner, it is possible to select memory cells of a memory array excellent in noise characteristics and small in size.

(Third Embodiment)

The third embodiment of the present invention will be described in detail with reference to FIG. 10. In this embodiment, the number of second word drivers is increased to increase the number of selections separated by second word lines, thereby increasing the number of bit line pairs taken charge of by each sense amplifier. As compared with the first embodiment, two second word drivers are provided on each of the left and right sides of each sense amplifier region. By doubling the number of second word drivers, the number of bit line pairs input to each sense amplifier is increased from two to four so that the number of sense amplifiers can be reduced by half and thus the sense amplifier area can be further reduced. Incidentally, in this case, sharing of each sense amplifier is enabled not only in the folded bit line layout, but also in the open bit line layout.

Figure 10:
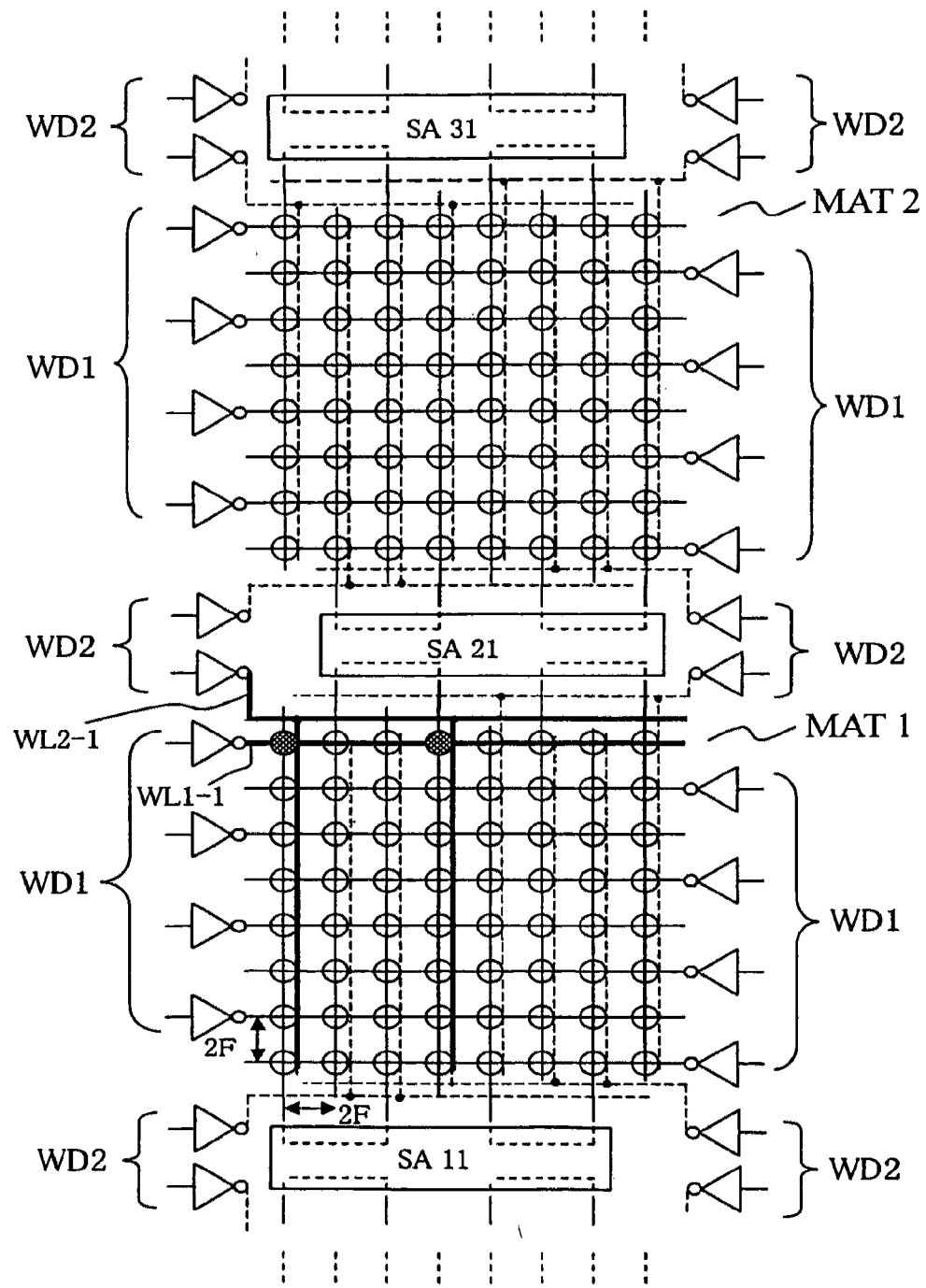
FIG. 10 is an explanatory diagram of memory cell selection in a third embodiment of the present invention.
Figure 11:
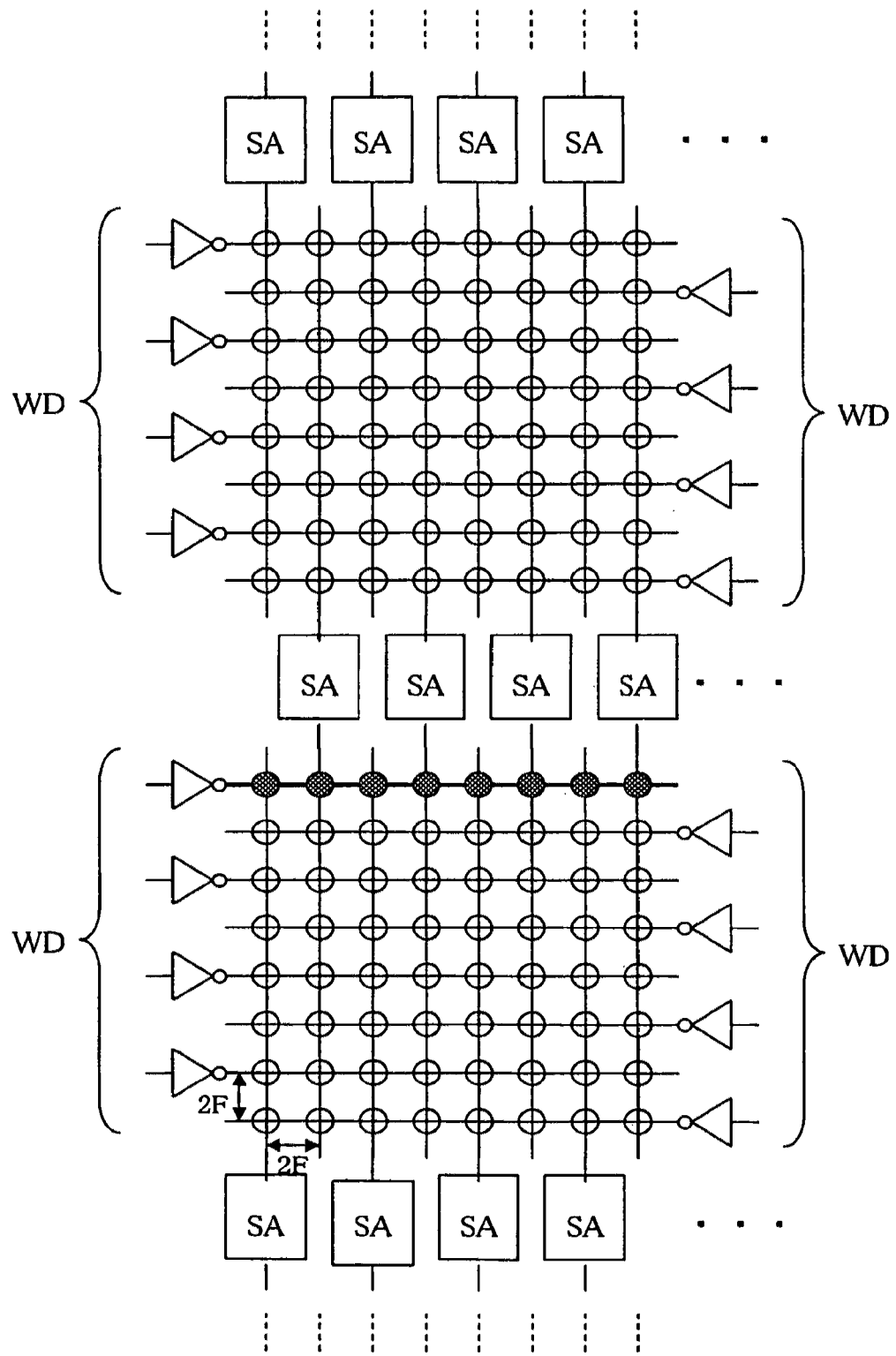
FIG. 11 is a layout explanatory diagram of a memory array of open bit line layout.

In FIG. 10, one of first word drivers WD1 is selected so that a first word line WL1-1 is activated and one of second word drivers WD2 is selected so that a second word line WL2-1 is activated. As a result, the word lines indicated by thick lines in the figure are activated so that memory cells at intersections therebetween, i.e. the crosshatched memory cells disposed in a mat 1 in the figure, are selected. That is, a sense amplifier SA11 receives a bit line BL1 as a true bit line and a bit line BL2 as a dummy bit line and senses a memory cell 11. A sense amplifier SA21 receives a bit line BL3 as a dummy bit line and a bit line BL4 as a true bit line and senses a memory cell 14.

In this embodiment, the number of second word drivers is increased, thereby increasing the number of bit line pairs taken charge of by each sense amplifier. Herein, by doubling the number of second word drivers, the number of sense amplifiers is reduced by half. Accordingly, each sense amplifier is shared by a plurality of bit line pairs in the same mat and further by a plurality of bit line pairs in an adjacent mat in either upper or lower direction. By increasing the number of second word drivers to reduce the number of sense amplifiers in this manner, it is possible to select memory cells of a memory array excellent in noise characteristics and small in size.

In the present invention, each of memory cells comprises two transistors and one storage element connected in series in this order between a corresponding one of bit lines and a constant voltage. Gate electrodes of the two transistors are respectively connected to a corresponding one of first word lines and a corresponding one of second word lines. The transistors are surround gate transistors. By stacking the transistors in two tiers at the same planar position, the memory cell size can be made small. The bit line layout is a folded bit line layout in which bit line pairs are disposed in the same mat and further the memory cells are disposed at all intersections between the bit lines and the first word lines. The memory cell can be selected and accessed by selecting the corresponding first and second word lines. According to the present invention, there is obtained a memory array which is excellent in noise characteristics because of the folded bit line layout and which is small in size because the memory cells are disposed at all intersections between the bit lines and the first word lines. Further, there are obtained a semiconductor integrated circuit device having such a memory array and a method for accessing such a semiconductor integrated circuit device.

While the present invention has been described with reference to the embodiments, the present invention is not limited thereto. Various changes can be made to the structures and details of the present invention within the scope of the present invention.

What is claimed is:

1. A semiconductor integrated circuit device comprising a memory array comprising:
    mats each comprising memory cells each having two transistors and one storage element connected in series in this order between a corresponding one of bit lines and a constant voltage, said two transistors respectively having gate electrodes respectively connected to a corresponding one of first word lines orthogonal to said bit lines and a corresponding one of second word lines parallel to said bit lines, and said memory cells disposed at all intersections between said bit lines and said first word lines;
    sense amplifiers each input with a corresponding pair of the bit lines in the same mat as a bit line pair;
    first word drivers adapted to activate said first word lines, respectively; and
    second word drivers adapted to activate said second word lines, respectively.

2. The semiconductor integrated circuit device according to claim 1, wherein said two transistors comprise surround gate transistors stacked in two tiers at a same planar position and the memory cell is selected by simultaneously activating the corresponding first and second word lines.

3. The semiconductor integrated circuit device according to claim 1, wherein said storage element comprises a capacitor and wherein said capacitor comprises a stack capacitor formed above a semiconductor substrate and said bit lines are formed buried in said semiconductor substrate.

4. The semiconductor integrated circuit device according to claim 1, wherein said storage element comprises a capacitor and wherein said capacitor comprises a trench capacitor formed buried in a semiconductor substrate and said bit lines are formed above said semiconductor substrate.

5. The semiconductor integrated circuit device according to claim 1, wherein said first word lines are orthogonal to said bit lines, said second word lines are parallel to said bit lines, and said first and second word lines are orthogonal to each other and wherein, by simultaneously selecting and activating the corresponding first and second word lines, the memory cell at the intersection therebetween is selected.

6. The semiconductor integrated circuit device according to claim 1, wherein each of said sense amplifiers is shared by the corresponding bit line pairs disposed in adjacent mats.

7. The semiconductor integrated circuit device according to claim 6, wherein said each of said sense amplifiers is shared by the corresponding bit line pairs disposed in each of said adjacent mats.

8. The semiconductor integrated circuit device according to claim 1, wherein each of said second word drivers is shared between adjacent mats.

9. A method for accessing a semiconductor integrated circuit device comprising a memory array comprising mats each comprising memory cells each having two transistors and one storage element connected in series in this order between a corresponding one of bit lines and a constant voltage, said two transistors respectively having gate electrodes respectively connected to a corresponding one of first word lines orthogonal to said bit lines and a corresponding one of second word lines parallel to said bit lines, and said memory cells disposed at all intersections between said bit lines and said first word lines, sense amplifiers each input with a corresponding pair of the bit lines in the same mat as a bit line pair, first word drivers adapted to activate said first word lines, respectively, and second word drivers adapted to activate said second word lines, respectively, said method comprising:

accessing a first memory cell by selecting the corresponding first and second word lines;

then accessing a second memory cell by non-selecting said second word line;

precharging and equalizing the bit lines; and selecting the second word line at a different address.

10. The semiconductor integrated circuit device according to claim 1, wherein each said mat has its own said second word driver.

11. The memory array according to claim 10, wherein each said mat has its own said second word driver.

12. A semiconductor integrated circuit device comprising:
a bit line;
a first word line;
a second word line; and
a first transistor, a second transistor and a storage element coupled in series between the bit line and a terminal supplying a specific voltage to form a memory cell, a gate of the first transistor coupled to the first word line, and a gate of the second transistor coupled to the second word line.

13. The device according to claim 12, wherein each of said first and second transistors comprises a surround gate transistor.

14. The device according to claim 12, further comprising a first word driver coupled to the first word line to drive the first word line, and a second word driver coupled to the second word line to drive the second line.

15. The device according to claim 14, wherein the first and second word driver respectively drive the first and second word line when a data stored in the storage is read out to the bit line and a data on the bit line is stored to the storage.

16. The device according to claim 12, wherein the first word line is elongated to a first direction and the bit line is elongated to a second direction different from the first direction.

17. The device according to claim 12, wherein the first word line is elongated to a first direction and the second word line is elongated to a second direction different from the first direction.

18. The device according to claim 12, wherein the first transistor, the second transistor and the storage element are vertically arranged.

19. The device according to claim 12, wherein the storage element is a capacitor.

20. The device according to claim 14, wherein the first word driver drives the first word line in a first period and the second word driver drives the second word line in a second period different from the first period.

* * * * *